United States Patent
Choi

Patent Number: 5,889,705
Date of Patent: Mar. 30, 1999

[54] METHOD FOR ERASING ELECTRICALLY ERASABLE AND PROGRAMMABLE MEMORY CELLS

[75] Inventor: Yong-Bae Choi, Suwon, Rep. of Korea

[73] Assignee: Samsung Electronics, Co., Ltd., Suwon, Rep. of Korea

[21] Appl. No.: 862,139

[22] Filed: May 22, 1997

[30] Foreign Application Priority Data

Jun. 5, 1996 [KR] Rep. of Korea .................. 1996/20048

[51] Int. Cl.⁶ .................................................. G11C 16/00
[52] U.S. Cl. ............................. 365/185.29; 365/185.18; 365/185.27
[58] Field of Search ................ 365/185.27, 185.18, 365/185.29

[56] References Cited

U.S. PATENT DOCUMENTS 5,349,220  9/1994  Hong .................................. 365/185.18
5,438,542  8/1995  Atsumi et al. ..................... 365/185.27

*Primary Examiner*—Tan T. Nguyen
*Attorney, Agent, or Firm*—Marger Johnson McCollom, P.C.

[57] ABSTRACT

Charges stored in a non-volatile semiconductor memory cell are erased in a manner that reduces leakage current. The cell includes source and drain regions formed on one surface of a semiconductor substrate. A channel region is defined by the source and drain regions. A tunnel oxide layer is formed over the channel region and a floating gate layer is formed on the tunnel oxide layer to store the charges. A control gate layer is formed over the floating gate. A first positive voltage is applied to the source region and a negative voltage is applied to the control gate layer. A second positive voltage is applied to the substrate. The combination of applied voltages reduces leakage current, in turn improving cell operating performance.

12 Claims, 4 Drawing Sheets

METHOD FOR ERASING ELECTRICALLY ERASABLE AND PROGRAMMABLE MEMORY CELLS

BACKGROUND OF THE INVENTION

1. Field of the Invention

The present invention relates to non-volatile semiconductor memory cells and more particularly to a method and apparatus for erasing data stored in electrically erasable programmnable read only memories (EEPROMs) that reduces band-to-band leakage current.

2. Description of the Related Art

Conventional erasable programmable read only memories (EPROMs) include a multiplicity of memory cells. Each memory cell of a typical metal oxide semiconductor device has a floating gate layer located underneath a control gate layer. A channel layer is defined by drain and source regions on the surface of a semiconductor substrate. The floating gate layer lies over the channel layer and is completely insulated from other portions by an insulating layer such as a SiO₂ layer.

Programming of data in the EPROM is usually carried out by applying 10 to 20 or more volts between the drain and source regions and applying an appropriate voltage to the control gate. Application of these voltages cause electrons to be accelerated across the channel layer, thereby producing electron-hole pairs by impact ionization. Once these electrons gain sufficient energy, they overcome the potential barrier of a gate oxide layer on the channel and inject into the floating gate layer. The injected electrons increase a threshold voltage of the memory cell. Thus, the memory cell can store a logic state "1" or "0" different from the initial erased state.

In an erasing operation, ultra-violet (UV) light is irradiated to the floating gate. Electrons stored in the floating gate absorb the exiting UV energy. The exiting electrons are carried away to the substrate through the gate oxide, causing the cells to store the erased state.

One improvement for such EPROMs is an electrically erasable and programmable read only memory (EEPROM). The EEPROM includes a control circuit for controlling programming and erasing operations. A voltage multiplying circuit generates high voltages, necessary for programming and erasing data from a single power source, such as 5 volts. EEPROMs are currently in wider use than EPROMs due to the simplicity of their programming and erasing. For example, one use for EEPROMS is in integrated circuit cards.

Referring to FIG. 1, symmetrical source region 6 and drain region 4 are doped with N+ impurities and are formed on a p-type semiconductor substrate 2. The source region 6 and drain region 4 are separated by a channel region over which is positioned a tunnel oxide layer having a thickness of about 100 Å. A floating gate 8 is positioned on the tunnel oxide layer. An intermediate insulating layer of oxide-nitride-oxide (ONO) having a thickness of about 250 Å is formed on the floating gate 8. A control gate 10 is positioned on the intermediate insulating layer. Thus, the transistor cell has a stack type structure.

Another prior art EEROM structure is shown in FIG. 2 and an EEPROM structure used in the present invention is shown in FIG. 3. The EEPROM structures in FIGS. 2 and 3 are substantially identical to the structure shown in FIG. 1, except for the technique and structure for erasing data. Thus, the explanation of the structures shown in FIGS. 2 and 3 will be omitted to avoid duplication.

Referring to FIG. 1, the cell is erased by applying a high voltage Vpp, such as 12 volts, to the source region 6, holding the control gate 10 and the substrate 2 at ground potential and floating the drain region 4. This erasing approach has an advantage of reducing the applied erase voltage Vpp to about 12 volts as compared with a bulk erasing in which an erase voltage of about 20 volts is applied to the substrate.

The potential difference of 12 volts between the substrate 2 and the source region 6 produces a leakage current. Also, the potential difference of 12 volts between the source region 6 and the control gate 10 through the thin tunnel oxide causes a portion of the source region 6, overlapping the floating gate 8, to be deep-depleted. A small amount of charge is injected into the thin tunnel oxide layer, lowering the potential barrier of the tunnel oxide, for electron tunneling (i.e. causing band-bending). Thus, the presence of the high potential difference between the source region 6 and control gate 10 results in another leakage current referred to as a band-to-band leakage current.

These leakage currents disturb normal erasing operations of the cell. For example, a typical EEPROM chip with a single power supply includes a voltage multiplying circuit for generating high erase and program voltages. If a block erasing operation of the chip is performed, a multiplicity of cells in the block must be simultaneously erased. Due to the leakage currents in each cell, the constant current capacity of the voltage multiplying circuit is insufficient for erasing all of the cells in the block. Thus, the cells cannot be erased.

FIG. 2 shows a prior art method of erasing data in a transistor cell. Erasing is performed by applying a supply voltage Vcc to a N+ source region 6, applying negative 10 volts to control gate 10, floating N+ drain region 4 and grounding the substrate 2. The lowered voltage of the source region decreases a source-substrate junction leakage current. However, the potential difference between the source region 6 and the control gate 10 does not considerably reduce the band-to-band leakage current. The electric field across the thin tunnel oxide layer is slightly greater than that in FIG. 1 and the electron-tunneling induced hole generation in the oxide layer is no less than that in FIG. 1. Thus, the transistor in FIG. 2 is no more effective in reducing the total leakage current than the transistor in FIG. 1.

As discussed above, electron tunneling, alternatively referred to as Fowler-Nordheim tunneling, occurs through a small tunneling region of the thin tunnel oxide layer overlapping the source region 6 and the floating gate 10. Since reprogramming cells requires the cells also be erased, every cell must generally keep a constant threshold voltage over a certain number of program-erase cycles. In the case of block erasing, threshold voltages of cells (bits) in the block must be densely distributed at a desired voltage, regardless of the number of program-erase cycles.

The tunnel oxide layer at the small tunneling region is stressed by the repeated erasing cycles. Repeated erasing cycles increase the number of holes trapped in the oxide layer causing changes in the threshold voltage. Variations in manufacturing conditions also cause variations in oxide thickness. This means that every cell in the block may not be erased to the same desired threshold voltage. Thus, block erased cells might not have a close distribution of threshold voltages. Therefore, it is necessary that during the erasing operation of the chip, the holes trapped in the tunnel oxide layer are reduced.

It is therefore an object of the present invention to provide a method of reducing band-to-band leakage current during erasing operations in nonvolatile semiconductor memory cells.

It is another object of the present invention to reduce holes trapped in a thin tunnel oxide during erasing operations in a nonvolatile semiconductor memory cell.

SUMMARY OF THE INVENTION

The invention erases charges stored in a non-volatile semiconductor memory cell. The cell is comprised of source and drain regions formed on one surface of a semiconductor substrate. A channel region is defined by the source and drain regions and a tunnel oxide layer is formed over the channel region. A floating gate layer is formed on the tunnel oxide layer to store the charges and a control gate layer is formed over the floating gate. The invention applies a first positive voltage to the source region, applies a negative voltage to the control gate, and applies a second positive voltage to the substrate. The applied voltages reduce leakage current and improve device performance.

The foregoing and other objects, features and advantages of the invention will become more readily apparent from the following detailed description of a preferred embodiment of the invention which proceeds with reference to the accompanying drawings.

DETAILED DESCRIPTION OF THE PREFERRED EMBODIMENT

Figure 1:
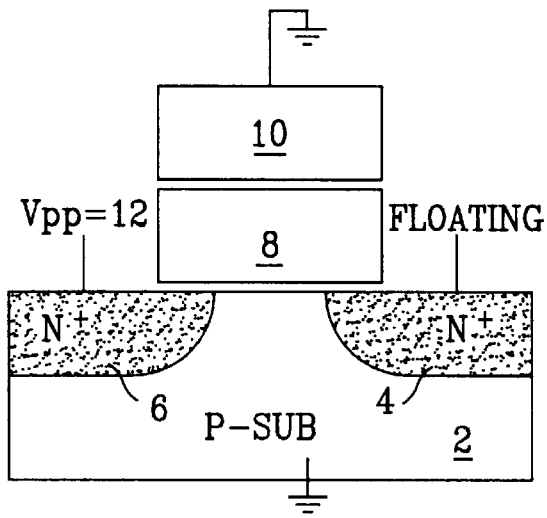
FIG. 1 is a cross-sectional view of a prior art memory cell showing a first cell erasing method.

A preferred embodiment for erasing a non-volatile semiconductor memory device according to the present invention will be described in detail with reference to the accompanying drawings. Various vertical cross-sectional views of a memory cell in a non-volatile semiconductor memory device are provided for better understanding of the disclosed invention. It should be appreciated by an expert skilled in the art that any particulars set forth in the drawings would not limit the scope of the invention. It is also noted that like numerals represent like portions or layers in the drawing.

Figure 2:
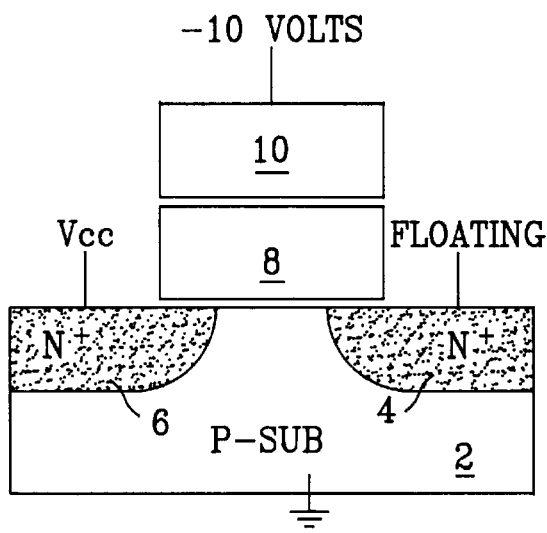
FIG. 2 is a cross-sectional view of a prior art memory cell showing a second cell erasing method.
Figure 3:
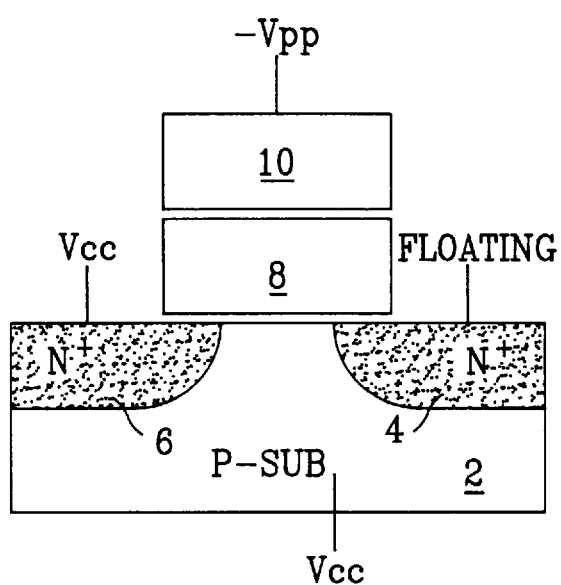
FIG. 3 is a cross-sectional view of a memory cell according to one embodiment of the present invention.

FIG. 3 shows a nonvolatile semiconductor memory cell according to the present embodiment. It is to be noted that the structure of the memory cell is similar to the stack gate structure shown in FIG. 2. Erasing in the present invention is accomplished by applying a high negative voltage Vpp, such as −10 volts, to the control gate 10. Positive voltages, such as a power supply voltage of 5 volts, is applied to the source region 6 and substrate 2 and have an absolute value (5 volts) less than the absolute value (10 volts) of the negative voltage Vpp. The drain region 4 is floating. The substrate 2 has a p-type well region formed on a semiconductor substrate. The positive voltage applied to the source region 6 is generally the same voltage Applied to the substrate 2. The substantially similar voltages on the source 6 and substrate 2 block leakage current flowing through the source-to-substrate junction.

The electron tunneling, i.e. Fowler-Nordheim tunneling, occurs through a portion of the source region overlapping the floating gate 8 and the channel region. That is, electrons stored in the floating gate 8 are extracted to the source region 6. A relatively larger area is created for the tunneling region relating to the Fowler-Nordheim tunneling. This larger area significantly reduces electrical stresses imposed by erasing cycles as compared with those of the prior art. Thus, the present invention reduces the number of holes trapped in the oxide without causing stress degradations in the cell. This means that the same threshold voltage for the cell is maintained over a number of erasing cycles.

Further, charge retention characteristics of the cell are considerably improved because electrical stress no longer produces defects in the oxide. During a block erasing mode, threshold voltages of erased cells are distributed more uniformly in a narrower range of voltages.

Various modifications of the present invention are possible. For example, impurity concentrations in the source region are increased above the solid solubility of the impurity. The increase in impurity concentration collapse the deep depletion of the overlapping source region under the thin tunnel oxide during erase operations. Programming of the cell is conventional wherein hot electron injection is used from the channel region in the vicinity of the drain region to the floating gate and/or electron tunneling injection is used from a portion of the drain region overlapping the floating gate to the floating gate.

In the case of electron tunneling injection, the drain region is doped with the same impurity concentrations as the source region as set forth above. In the case of hot electron injection, hot electrons generated by the impact ionization in the channel region are maximized near the drain junction, enhancing programming speed. To scale down the cell, the channel region is heavily doped with the same conductivity type as that of the substrate. The scaled down cell increases programming speed and prevents a punch-through between source and drain regions.

Figure 4:
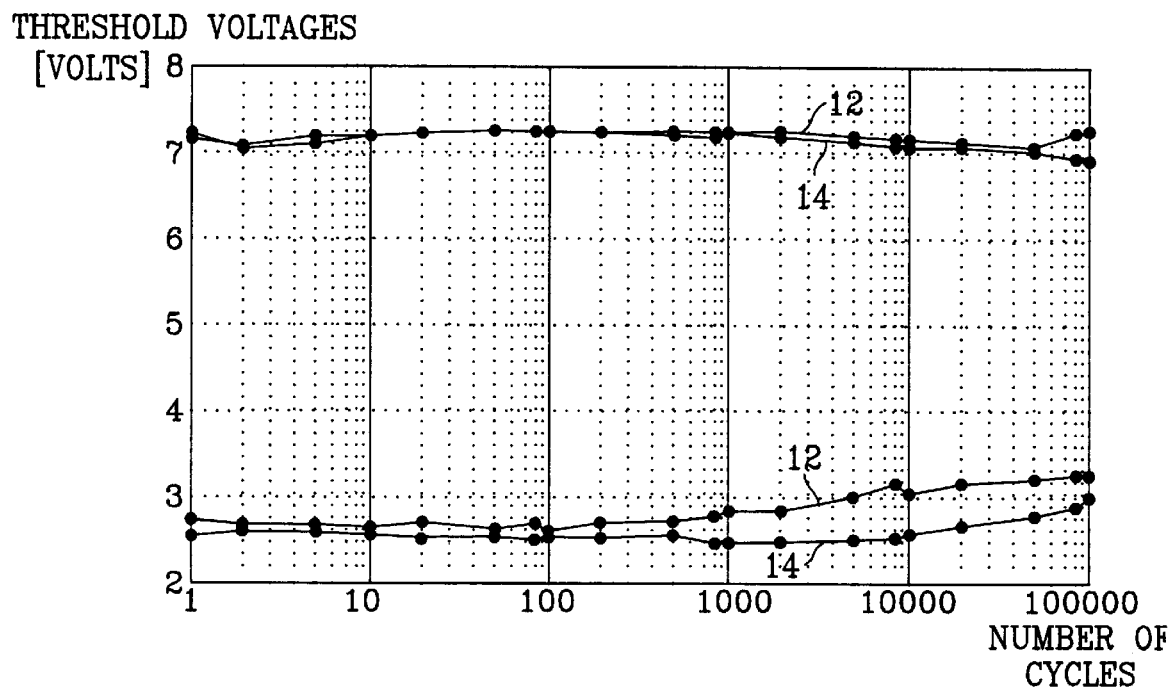
FIG. 4 is a graph showing threshold voltage variations with respect to program-erase cycles according to the prior art and the present invention.
Figure 5:
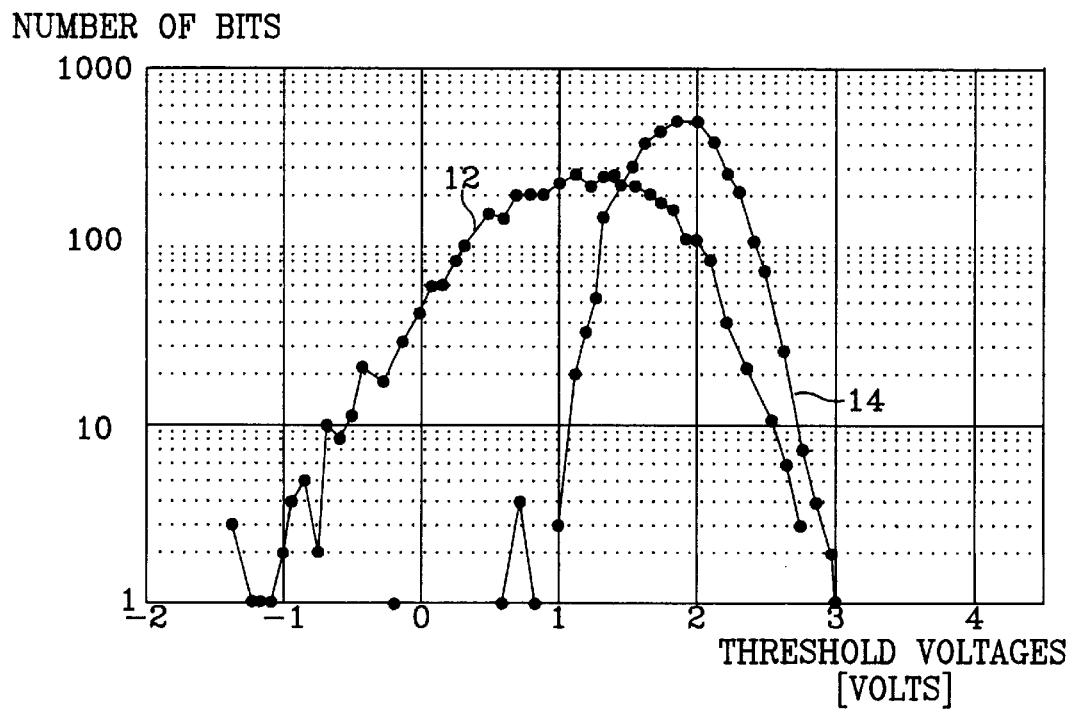
FIG. 5 is a graph showing threshold voltage distribution for block erased cells according to the prior art and the present invention.
Figure 6:
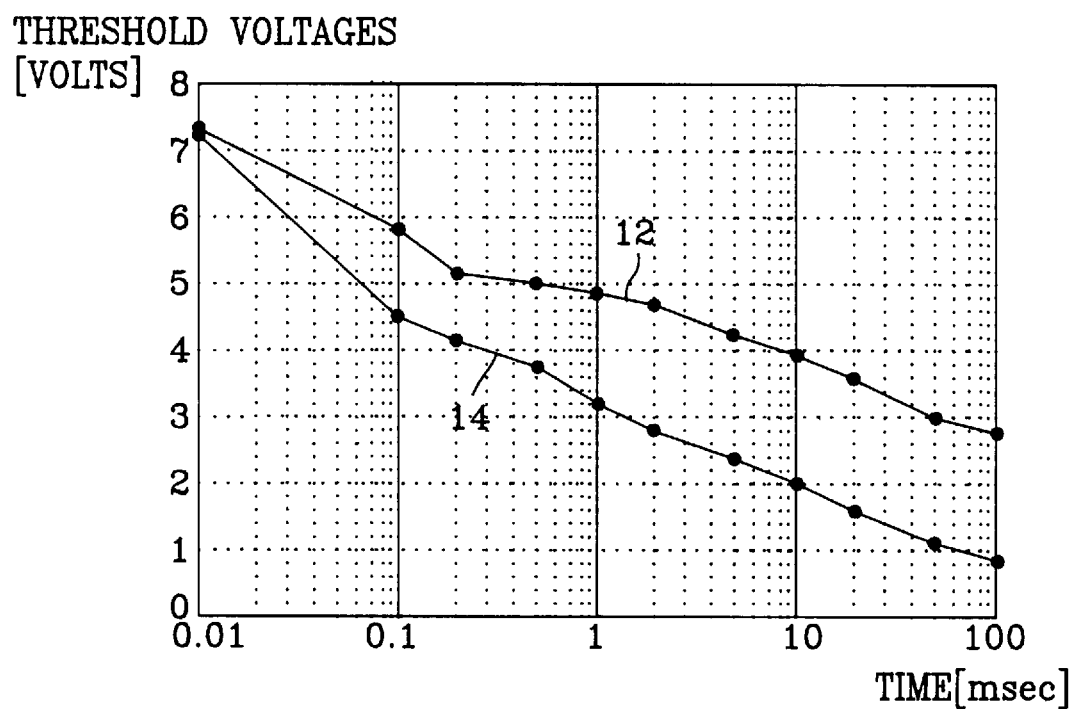
FIG. 6 is a graph showing erasing speed for cells according to the prior art and the present invention.

Features of the present invention shown in FIGS. 4 to 6 are based on experimental data. FIG. 4 compares endurance characteristics of the prior art of FIG. 2 with the present invention. In the drawing, reference numeral 12 represents the prior art and reference numeral 14 represents the present invention. The upper curves represent variations of threshold voltage for the programmed cells with respect to program-erase cycles. Both lower curves represent variations in threshold voltages for the erased cells with respect to program-erase cycles. As shown in the graph, there are no variations of threshold voltages for the erased cell of the present invention up to about 10,000 cycles while the variation of threshold voltage for the prior art erased cell occurs at about 1,000 cycles.

FIG. 5 shows threshold voltage distribution for the prior art 12 of FIG. 2 and the present invention 14, when a block of cells are erased at the same time. As shown in the graph, threshold voltages for the block erased cells 14 of the present invention are distributed in a narrower voltage range than those of the prior art 12.

FIG. 6 compares erasing speed characteristics for the prior art 12 of FIG. 2 and the present invention 14. As shown in the graph, the cell for the present invention 14 reaches a desired erased threshold voltage, such as approximately 2.5 volts, in approximately 2.4 millisecond. The cell for the prior art 12 takes significantly longer than 2.4 milliseconds to reach the desired 2.5 volts. Thus, the erasing speed of the present invention is faster than the prior art.

Although the foregoing embodiment of the invention has been described for flash-EEPROM, it is appreciated that other types of non-volatile semiconductor memory devices would also have improved threshold voltage performance using the invention. Accordingly, it should be understood that the present invention is not limited to the specific embodiment disclosed in this specification.

Having described and illustrated the principles of the invention in a preferred embodiment thereof, it should be apparent that the invention can be modified in arrangement and detail without departing from such principles. I claim all modifications and variation coming within the spirit and scope of the following claims.

What is claimed is:

1. A method for erasing charges stored in a non-volatile semiconductor memory cell, wherein said cell is comprised of source and drain regions formed on one surface of a semiconductor substrate, a channel region defined by said source and drain regions, tunnel oxide layer formed over said channel region, a floating gate layer formed on said tunnel oxide layer to store said charges, and a control gate layer formed over said floating gate, said method comprising:

applying a first positive voltage to said source region;

applying a negative voltage to said control gate layer; and applying a second positive voltage to said substrate that is about the same voltage level as the first positive voltage.

2. The method of claim 1 wherein the substrate has a first conductivity type and the source and drain regions have a second conductivity type opposite to the first conductivity type.

3. The method of claim 1 wherein the negative voltage has a larger absolute value than an absolute value of the first and second positive voltages.

4. The method of claim 1 including increasing impurity concentrations in the source region above a solid solubility of the impurity and doping the drain region with the same impurity concentrations as the source region.

5. A method for erasing data stored in a cell of a non-volatile semiconductor memory device, said cell including source and drain regions formed on one surface of a semiconductor substrate, a channel region defined by said source and drain regions, a tunnel oxide layer formed over said channel region, a floating gate formed over said tunnel oxide layer to store said data and a control gate formed over said floating gate, said method comprising:

providing a positive voltage to said source region;

providing a negative voltage to said control gate; and providing said positive voltage to said substrate having substantially a same voltage level as the positive voltage provided to the source.

6. The method of claim 5 wherein the source region has a heavily doped impurity concentration.

7. A non-volatile semiconductor memory device, comprising:

a substrate biased with a positive voltage;

multiple cells formed on the substrate, the multiple cells each having:
a source region biased with the same positive voltage value used for biasing the substrate;
a drain region;
a channel region defined by the source and drain regions;
a tunnel oxide layer formed over the channel region;
a gate formed over the tunnel oxide layer for storing data; and
a control gate formed over the gate and biased with a negative voltage, the bias voltages reducing generation of a band-to-band leakage current during an erasing operation of the data stored in the multiple cells.

8. A method for erasing charges stored in a non-volatile semiconductor memory cell, wherein said cell is comprised of source and drain regions formed on one surface of a semiconductor substrate, a channel region defined by said source and drain regions, said method comprising:

forming a tunnel oxide layer over the channel region and partially over the source and drain regions;

forming a floating gate layer on said tunnel oxide layer to store said charges and a control gate layer formed over said floating gate, a tunneling region established between the gate layer and the source region;

applying a first positive voltage to said source region;

applying a negative voltage to said control gate layer;

floating the drain region; and applying a second positive voltage to said substrate.

9. The method of claim 8, wherein said first and second positive voltages are about the same voltage levels.

10. The method of claim 9, wherein said substrate has a first conductivity type and each of said source and drain regions has a second conductivity type opposite to said first conductivity type.

11. The method of claim 10, wherein the channel is heavily doped with a same conductivity type as the substrate and the source and drain regions are doped with a same impurity concentration.

12. The method of claim 11, wherein said source region has a heavily doped impurity concentration.

* * * * *